United States Patent [19]

Williams

[11] Patent Number: 4,878,017
[45] Date of Patent: Oct. 31, 1989

[54] HIGH SPEED D.C. NON-CONTACTING ELECTROSTATIC VOLTAGE FOLLOWER

[76] Inventor: Bruce T. Williams, 454 South St., Lockport, N.Y. 14094

[21] Appl. No.: 924,054

[22] Filed: Oct. 28, 1986

[51] Int. Cl.$^4$ ........................ G01R 5/28; G01R 29/12
[52] U.S. Cl. ................................ 324/109; 324/123 R; 324/457; 324/458; 330/10
[58] Field of Search .................... 324/72.5, 172, 109, 324/123 R, 123 C, 457, 458, 130; 307/359, 264; 330/10, 100, 85; 328/167

[56] References Cited

U.S. PATENT DOCUMENTS

| 3,851,242 | 11/1974 | Vosteen et al. | 324/109 |
| 3,867,695 | 2/1975 | Fay, Jr. et al. | 324/123 R |
| 3,887,877 | 6/1975 | Vosteen | 330/10 |
| 4,063,154 | 12/1972 | Andrus et al. | 324/109 |
| 4,205,267 | 5/1980 | Williams | 324/458 |
| 4,270,090 | 5/1981 | Williams | |
| 4,331,927 | 5/1982 | Scholz | 330/100 |
| 4,370,616 | 1/1983 | Williams | 324/458 |
| 4,562,429 | 12/1985 | Conway et al. | 324/457 |
| 4,628,256 | 12/1986 | Powell | 330/10 |

FOREIGN PATENT DOCUMENTS

| 0069060 | 5/1980 | Japan | 324/458 |
| 0056266 | 4/1985 | Japan | 324/457 |

Primary Examiner—Reinhard J. Eisenzopf
Assistant Examiner—W. Burns
Attorney, Agent, or Firm—Christel, Bean & Linihan

[57] ABSTRACT

A non-contacting electrostatic voltage follower employs a vibrating capacitance detector coupled to a measured surface containing both wideband electrostatic A.C. data and D.C. potentials. A detector amplifier having an inverting input is connected to the detector, while its output is connected to the input of a high bandwidth amplifier. A first feedback path is provided from the output of the high bandwidth amplifier to the non-inverting input of the detector amplifier which provides both a signal which is equal to and follows the wideband electrostatic A.C. potentials on the measured surface, and a signal, at the vibrating capacitance modulation frequency, representative of the D.C. potential of the measured surface. A second feedback path is provided including a demodulator and integrator to monitor the first feedback path to provide a D.C. correction signal to the high bandwidth amplifier to null the signal on the first feedback path which is representative of the vibrating capacitance modulation of the D.C. potential of the measured surface. As a result, the monitored signals on the first feedback path will be driven to, follow, and exactly match all wideband A.C. and D.C. electrostatic data on the measured surface. An electrostatic probe employs a vibrating transparent detector element and is disposed in a path of radiation whcih is directed onto a measured electrostatic surface.

15 Claims, 5 Drawing Sheets $V_t$ DUE TO $C \cdot \frac{dV_s}{dt}$ $V_t$ DUE TO $V_s \cdot \frac{dc}{dt}$ $V_t$ DUE TO $C \cdot \frac{dV_s}{dt} + V_s \cdot \frac{dc}{dt}$

HIGH SPEED D.C. NON-CONTACTING ELECTROSTATIC VOLTAGE FOLLOWER

BACKGROUND OF THE INVENTION

This invention relates to the electrical measurement art, and more particularly to a new and improved non-contacting electrostatic voltage follower.

A d.c. electrostatic voltage follower is a device used to measure the d.c. voltage level of conducting or dielectric surfaces in a non-contacting manner. An important application of this device is in the mesurement of the voltage levels of photoconductor surfaces used in electrophotographic processes, i.e. xerography. In these processes latent images are stored as electrical charges on a photoconductive surface to produce different voltage levels corresponding to the optical image exposed on the surface. To read these voltage levels without disturbing the small charges which produced them, non-contacting electrostatic voltage followers are employed. Using an electrostatic voltage follower, the sensing probe, which is coupled to the photoconductor surface under test, is driven to the same voltage as the measured voltage level of the surface. This voltage following technique assures no disruption of the surface charge which would result in voltage level errors, due to capacitive loading of the surface by the probe, or which would cause damage to the surface due to electrical discharge or arcing between probe and surface, particularly where the high surface voltage levels of 1,000 volts to 2,000 volts are measured in electrophotography. The assurance of no capacitive error or discharge can only be maintained if a physically closely coupled sensing probe can follow all variations in surface voltage levels to maintain a zero voltage difference between probe and surface at all times.

Recently, due to technological advances in electrophotography, high speed copying and laser printing machines, both of which use electrophotography processes, have emerged. In these high speed processes, the photoconductive surface moves at a high speed and presents very fast variations of voltage levels to the electrostatic voltage follower probe coupled to it. It is necessary, therefore, to provide increased bandwidth or speed of response of the electrostatic voltage follower over currently available devices to provide accurate surface voltage information as well as to insure no capacitive errors and surface arcing.

In another application, where different chemical composition and structure of photoconductive surface materials are evaluated for their electrical and optical characteristics, a d.c. electrostatic voltage follower is employed to monitor surface voltage performance. In a typical evaluation test, where the light decay characteristic of a material is to be evaluated, the material is charged in the dark to an initial voltage level. The surface is then radiated with light of various intensities and wavelengths while the surface voltage level is monitored to determine the rate of speed at which the surface discharges, i.e. rate at which surface voltage changes, as a function of the intensity, wavelength, and other variables.

Recently, with the development of amorphous silicon and other improved light decay speed photoconductive surface materials, non-contacting electrostatic voltage followers having increased bandwidth or speed of response are required to accurately indicate the light decay speed of the material. Heretofore, the electrostatic surface voltage measurement devices used for these surface evaluation measurements have been either of the wire loop type or of the transparent dual detector electrode type. The disadvantages of the use of wire loop detectors are numerous. They cannot detect the d.c. level of the surface and therefore are unstable and require repeated resetting. In addition, they do not couple to the same area on the surface which is being radiated and therefore introduce measurement errors. The transparent dual detector electrode types offer good bandwidth and d.c. stability, but they are large in size and do not transmit radiation to the surface uniformly because of the required gap between the detector electrodes. This gap allows the electrodes to operate independently, i.e. 180° out of mechanical phase, but it offers different spectral transmission characteristics through the gap areas than through the transparent electrode areas, thus generating transmission and reflection errors.

The response speed of all current art d.c. electrostatic voltage followers which employ a single detector electrode is relatively slow as compared to the speed of electrostatic data to be collected on modern xerographic machines and materials. In the current art d.c. follower, the capacitance or electrostatic field between the detector electrode in the sensing probe and the surface to be measured is modulated at a rate or frequency which is high as possible consistent with the available driving and handling power of the mechanical modulator as well as satisfying the requisite of producing enough modulation to reduce system noise and d.c. errors to acceptable values. In general, as the frequency of modulation increases the efficiency of modulation decreases to cause increased error and noise, while the reliability of the mechanical modulator decreases due to increased mechanical stress and strain. For these reasons, current art d.c. electrostatic followers employ capacitance of electrostatic field modulators which are limited to approximately one to two kilohertz in operating frequency.

The one to two kilohertz modulation frequency limit imposes a limit on the useful bandwidth obtainable from the d.c. electrostatic voltage follower or from any similar system which employs a feedback loop composed of a modulator, demodulator, and d.c. error integrating amplifier. The bandwidth is limited because the d.c. error signals from the demodulator, i.e. signals which indicate that the voltage follower is not following and holding the voltage difference between the probe and detector electrode and test surface at zero, cannot be generated any faster, i.e. at a frequency higher than the modulation frequency. This conventionally known limit known as the Nyquist Sampling Limit imposes a system bandwidth limit which is equal to one-half the frequency of modulation. Thus, current art d.c. electrostatic voltage followers using one to two kilohertz modulation frequency cannot have a bandwidth which exceeds 500 hertz to one kilohertz.

SUMMARY OF THE INVENTION

It is, therefore, a primary object of this invention to provide a new and improved non-contacting electrostatic voltmeter of the voltage follower type.

It is a further object of this invention to provide such a voltage follower which has relatively higher response speed.

It is a more particular object of this invention to provide such a high response speed non-contacting d.c. electrostatic voltage follower having a response speed independent of the frequency of modulation of the capacitance or electrostatic field between the detector electrode of the voltage follower and the measured surface.

It is a further object of this invention to provide such a high response speed non-contacting d.c. electrostatic voltage follower which employs a small probe assembly having a single electrostatic detector electrode.

It is a further object of this invention to provide such a high response speed non-contacting d.c. electrostatic voltage follower which produces accurate measurement of the optical and electrical characteristics of photoconductive or other materials by providing a probe which allows the same area of the material to be simultaneously and uniformly radiated and measured.

It is a further object of the present invention to provide such a non-contacting d.c. electrostatic voltage follower which employs a relatively low frequency of capacitive or electrostatic field modulation for increased modulation efficiency and reliability and to produce a system which features high speed and accuracy and low noise.

It is a further object of this invention to provide such a voltage follower capable of following both the static and dynamic characteristics of an external field or potential being measured.

It is a further object of this invention to provide such a voltage follower which is efficient and effective in operation and relatively simple in construction.

The present invention provides a non-contacting electrostatic voltage follower comprising a detector electrode sensitive to electrostatic quantities such as electrostatic fields, voltages, charges and the like, modulation means operatively associated with the electrode for providing capacitance modulation of the capacitance coupling between the electrode and a surface bearing an electrostatic quantity to which the electrode is exposed, a detector amplifier having a pair of inputs, one of which is connected to the detector electrode, and a high bandwidth amplifier having an input connected to the output of the detector amplifier. A first feedback path is provided from the output of the high bandwidth amplifier to the other input of the detector amplifier. A second feedback path is provided from the first feedback path to the input of the high bandwidth amplifier to cause the high bandwidth amplifier to produce at the output thereof a d.c. value necessary to null any signals in the first feedback path at the frequency of the modulation means. As a result, the signal in the first feedback path will follow and exactly match all a.c. and d.c. components of the electrostatic quantities on the surface over a wide frequency range, and that signal provides information as to magnitude and polarity of the electrostatic quantities.

The detector amplifier preferably comprises a current summing amplifier wherein the input is a summing input and the other input is a non-inverting input. The second feedback path includes an amplifier connected as a voltage follower and having the input thereof connected through a voltage divider to the first feedback path, a demodulator having an input connected to the output of the voltage follower amplifier and referenced to the modulation means, and an integrating amplifier having an input connected to the output of the demodulator and having an output connected to the input of the high bandwidth amplifier.

A probe according to the present invention comprises a transparent carrier element, a first conductive and transparent film on a surface of the carrier and defining the detector electrode, a second film of conductive and transparent material on the remainder of the surface of the carrier and spaced from the first film, and modulator means operatively associated with the carrier for modulating the capacitive coupling between the detector electrode and the surface bearing the electrostatic quantity. The carrier is disposed in a path for radiation onto the surface for irradiating a region of the surface in registry with the electrode and in a manner such that compensation is made for capacitive fringing effects by allowing for radiation of the fringing areas of the surface coupled to the detector electrode by fringing capacitance.

The foregoing and additional advantages and characterizing features of the present invention will become clearly apparent upon a reading of the ensuing detailed description together with the included drawing wherein:

BRIEF DESCRIPTION OF THE DRAWING FIGURES

DETAILED DESCRIPTION OF THE ILLUSTRATED EMBODIMENTS

Figure 1:
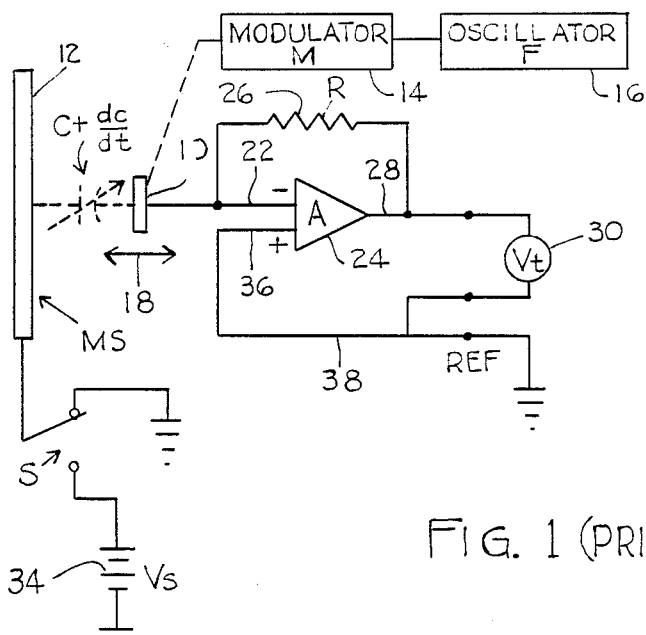
FIG. 1 is a schematic block diagram of a prior art non-contacting electrostatic detector.

FIG. 1 illustrates a prior art electrostatic probe and detector circuit. A detector electrode E also designated 10 which typically is a disc or other geometry conducting surface is capacitively coupled to measured surface MS also designated 12. A modulator M also designated 14 driven by electrical oscillator F also designated 16 is operatively coupled to and causes detector E to physically move, i.e. vibrate, in a plane normal to surface MS, as shown by the arrows 18, to produce a modulation of capacitance C by an amount dC/dt. Capacitance C is the physical capacitance between surface MS and electrode E. Detector E is connected to the summing input 22 of an amplifier A also designated 24, a current summing amplifier, which will hold detector E at virtual ground, i.e. zero volts as conventionally known. A resistor R also designated 26 is connected between the amplifier output 28 and summing input 22. An oscilloscope indicator 30 is connected to the output of amplifier A to indicate the voltage ($V_t$) produced by a current through resistor R. Surface MS can be connected to circuit ground through position 1 of switch S or to a voltage source $V_s$ also designated 34 in switch position 2. A reference potential for electrode E is applied to the positive, i.e. non-inverting, input 36 of amplifier A via line 38 as shown by the terminal marked REF. For this illustration terminal REF is returned to ground thereby applying a zero volt reference to detector E.

The current through resistor R, $i_R$, originates in the capacitance terms C and (dC/dt) and produces an amplifier A output voltage of $V_t$ equal to $i_R R$ i.e. $V_t = i_R R$. The current $i_R$ is equal to:

$$i_R = dQ/dt = C \cdot (dv/dt) + V \cdot (dC/dt)$$

where V is the voltage across capacitance C and is equal to $V_s$ because the voltage of electrode E remains at zero by the summing node connection of electrode E into amplifier A as conventionally known. Therefore, $i_R = (C) \cdot (dV_s/dt) + V_s (dC/dt)$. when switch S is connected to ground inposition 1, thereby making $V_s$ equal to zero, $i_R = (C) \cdot (O) + (O) \cdot (dC/dt) = 0$ and no $V_t$ appears. When switch S is moved to position 2 a voltage $V_t$ appears equal to:

$$V_t = i_R R = R[C \, dV_s/dt + V_s dC/dt]$$

Figure 2A:
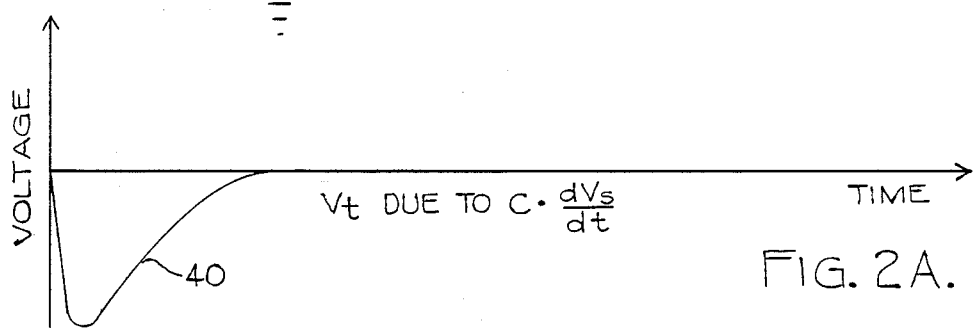
FIGS. 2a–2c are graphs including waveforms illustrating operation of the detector of FIG. 1.
Figure 2B:
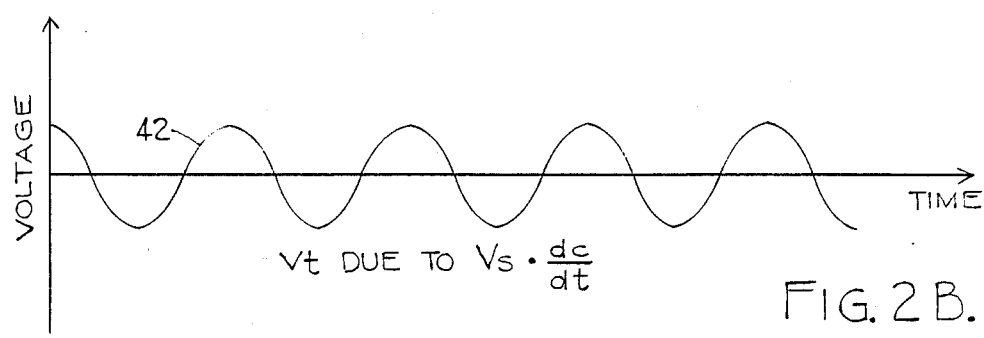
Figure 2C:
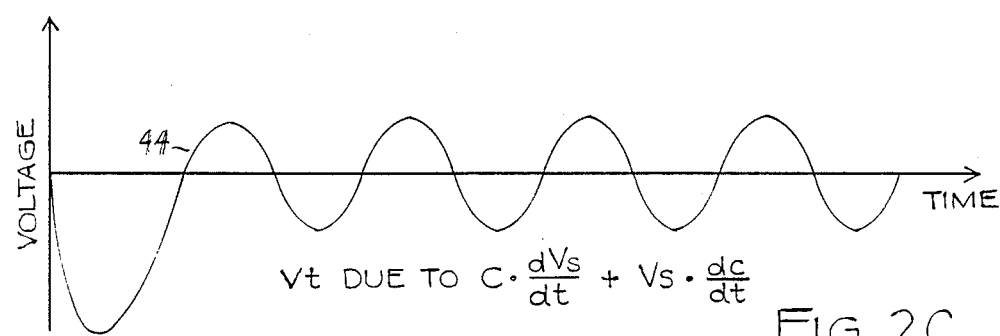

The voltage $V_t$ produced is equal to the sum of two currents: the current due to dvs/dt·C and the current due to $V_s$ dC/dt. A representation of the $V_t$ term is shown in FIG. 2 which shows each component of $V_t$ represented by waveforms 40 and 42, respectively, in FIGS. 2a and 2b and their summed total in FIG. 2c which appears as $V_t$ represented by waveform 44. In other detection systems which do not employ a detector electrode which is connected to the summing mode of amplifier A, i.e. high impedance detectors, the waveforms presented in FIG. 2 are applicable except the waveform in FIG. 2b. In the high impedance detector circuit, the voltage is generated by $(\Delta C/C) \cdot V_s$, where $(\Delta C/C)$ is the ratio of the variable to average value of the detector to surface capacitance. Either type of detector system is applicable for use in the voltage follower of the present invention.

Figure 3:
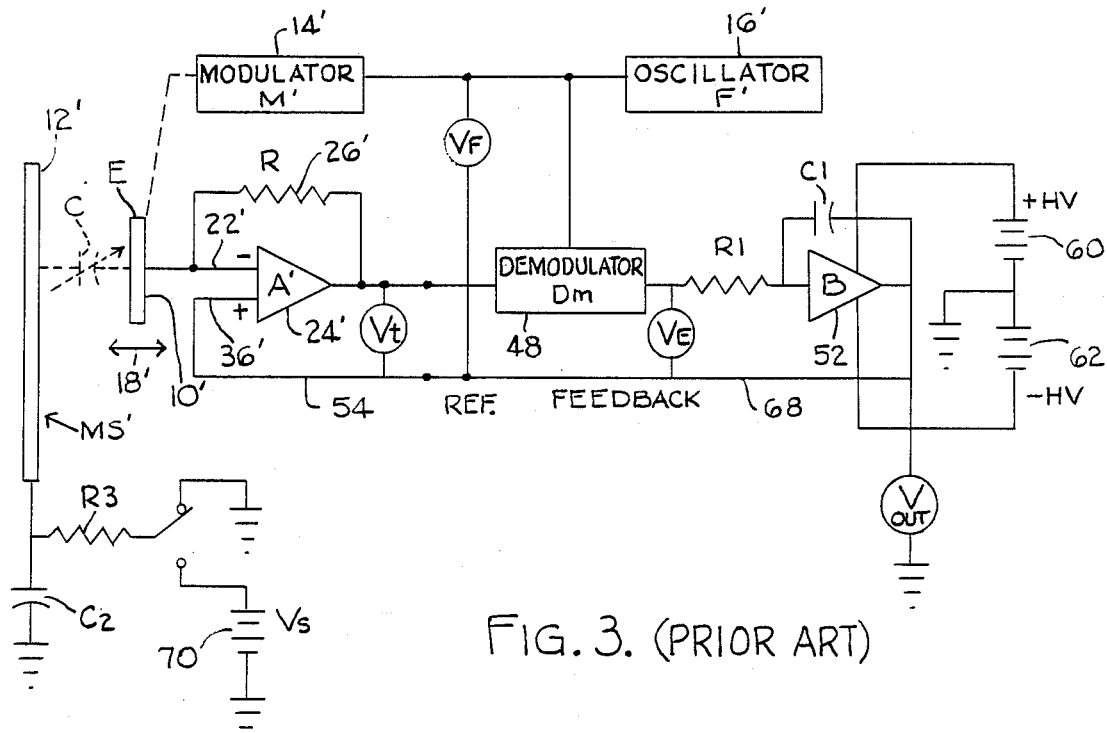
FIG. 3 is a schematic block diagram of a prior art non-contacting electrostatic voltage follower.

FIG. 3 illustrates a current art d.c. electrostatic voltage follower. A detector circuit similar to that of FIG. 1 or alternatively a high impedance detector circuit, either of which provides an output signal proportional to the differences in voltage between the detector reference potential and the surface under measurement MS', also designated 12', is connected into a feedback loop. The detector amplifier A' also designated 24' can be a zero impedance summing type as shown or a high impedance buffer type amplifier as previously explained. The output of amplifier A' provides a signal $V_t$ into a demodulator DM also designated 48. A signal $V_F$ correlated in frequency and phase to the modulation frequency of detector E' is used as a reference signal into demodulator DM to provide for demodulation of the $V_t$ signal to produce $V_E$, a d.c. signal proportional to the error voltage between the detector reference and test surface MS'. It should be noted the output of the demodulator DM contains only components of V(t) which are correlated to the modulation term dC/dt. All other components of $V_t$ which are generated by the dVs/dt term which are un-correlated to dC/dt will not contribute to the output VE of the demodulator DM. The signal $V_E$ is applied to the input of an amplifier B also designated 52 which is an integrating high level d.c. amplifier. The output of integrator B is fed back as the reference potential Ref via line 54 for detector E to close the feedback loop. The time constants provided by resistor R1 and capacitor C of amplifier B are chosen to limit system bandwidth to as high as is practical and yet achieve system stability and low noise. The resulting system bandwidth will be limited to less than one-half the modulation frequency as described by the Nyquist Criteria. The high voltage supplies represented by batteries 60 and 62 which provide voltage into high level amplifier B are chosen to have voltage values just above the measurement range of the test surface MS'. If unipolar measurements are made, i.e. either plus or minus, then either the minus or plus supply can be eliminated respectively. A voltage monitor labeled ($V_{out}$) also designated 64 is connected to the feedback line 68 to measure the detector reference potential (Ref).

Figure 4:
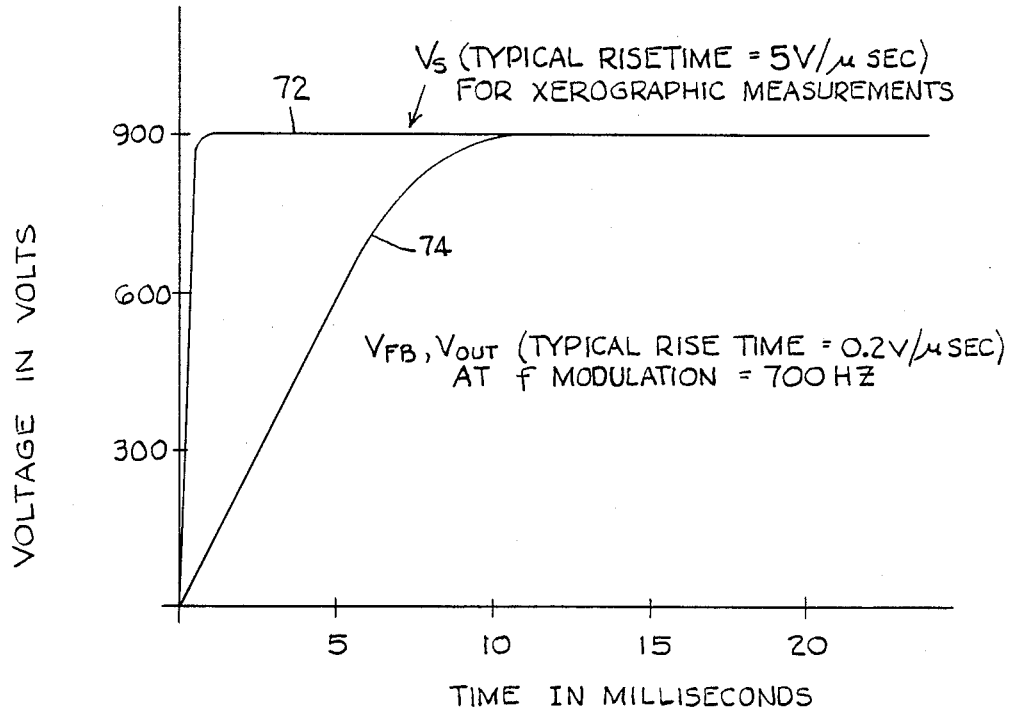
FIG. 4 is a graph including waveforms illustrating operation of the detector of FIG. 3.

In operation, if the reference potential Ref does not match the potential of surface MS', a signal $V_t$ will be generated at the modulation frequency $V_F$. The demodulator 48 will produce d.c. error $V_E$ to change the output of amplifier B and therefore the level of feedback applied to the Ref. terminal to exactly match and follow the surface MS' voltage. Shown in FIG. 4 is a graphical representation of the speed performance of this current art electrostatic d.c. voltage follower. A value of +900 volts from source 70 is switched to surface MS' by placing switch S into position 1. This causes surface MS' to change from 0 to +900 volts at a rate consistent with xerographic level changes of approximately 5V/uSec. as dictated by the constant provided by resistor R3 and capacitor C2. In FIG. 4, the rate at which the feedback voltage can change the reference potential Ref., as read on the $V_{out}$ indicator 64, is approximately 0.12/uSec. This is illustrated by the waveforms designated 72 and 74. This relatively slow response speed will cause capacitive loading and/or arcing between the detector probe and the test surface for close spacings between probe and surface.

Figure 5:
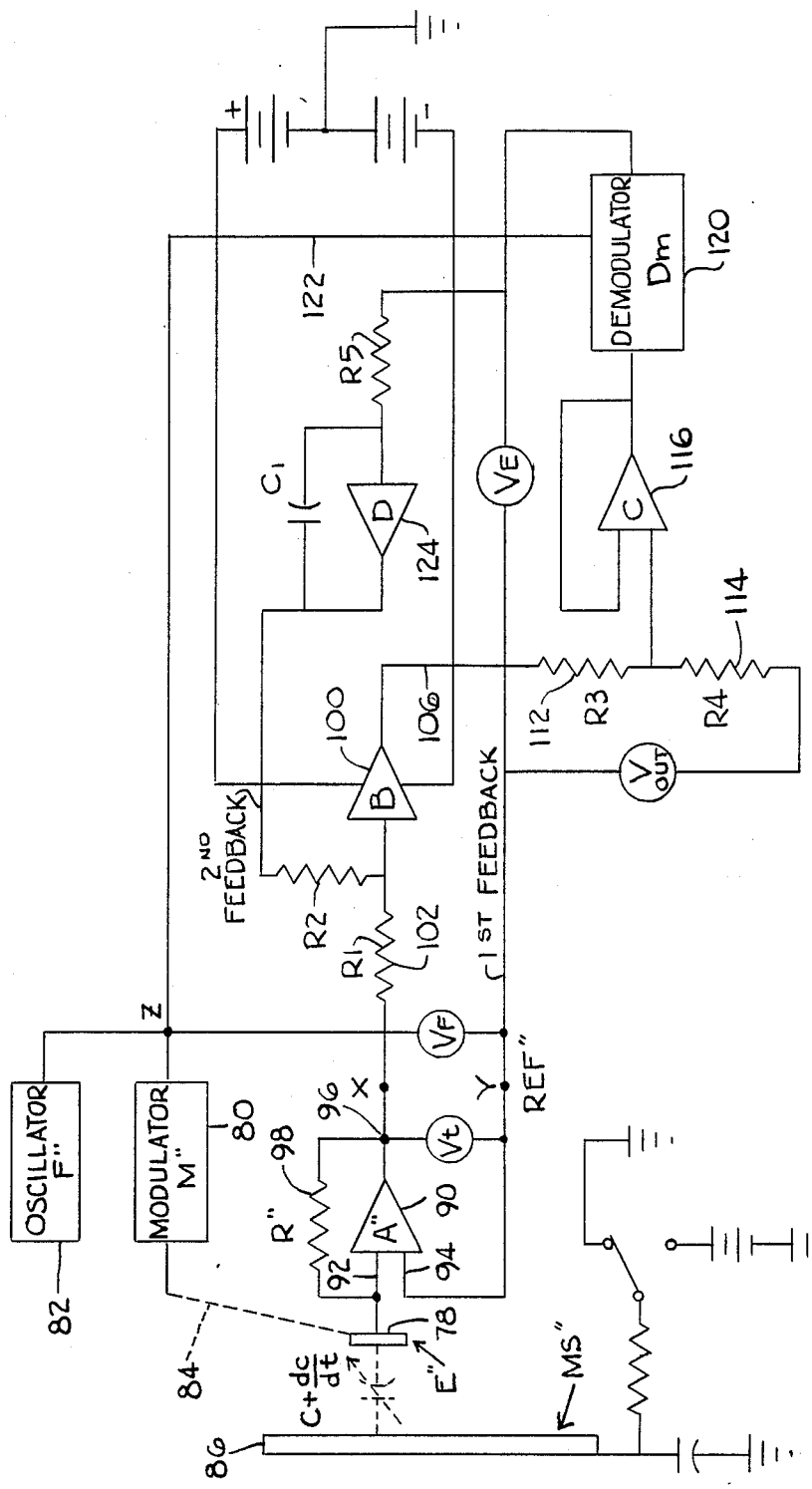
FIG. 5 is a schematic block diagram of a non-contacting electrostatic voltage follower according to the present invention.

A non-contacting electrostatic voltage follower according to the present invention is illustrated in FIG. 5. It comprises a detector electrode E" also designated 78 sensitive to electrostatic quantities such as electrostatic fields, charges and the like and means including modulator 80 driven by oscillator 82 operatively associated with electrode 78 as indicated by broken line 84 varying the capacitance coupling between electrode 78 and surface 86 also designated MS" bearing an electrostatic quantity to which electrode 78 is exposed. The electrostatic voltage follower further comprises a detector amplifier 90 having first and second inputs 92 and 94, respectively, and an output 96. In the present illustration amplifier 90 is a current summing amplifier wherein the first input 92 is a summing input and the second input 94 is a non-inverting input. The output 96 is connected by a resistor 98 to the summing input 92. Detector electrode 78 is connected to summing input 92. Thus, detector E" is connected, as before, into amplifier A, to produce a signal $V_t$ at point X representative of the current produced in detector E" which flows through R by the terms C (dv/dt)+V (dc/dt).

In the electrostatic voltage follower of the present invention the output of amplifier A" is not connected into a demodulator to detect the V (dc/dt) components, as in prior art devices, but is connected into a high level amplifier B also designated 100 through resistor R1 also designated 102. Amplifier B is a high bandwidth amplifier having wideband response characteristics and therefore can amplify all components of detector E" current which flows through R" and appears at terminal X. These current components include, as shown by figure 2a, all dynamic or changing voltages which appear on surface MS times the capacitance C between detector E" and surface MS", and by figure 2b current due to any d.c. voltage differences between detector E" and surface MS" times the change in the detector E" to surface MS" capacitance (dC/dt).

The electrostatic voltage follower according to the present invention further comprises means for providing a first feedback path from the output of high bandwidth amplifier 100 to the second input 94 of detector amplifier 90 in a manner following and matching all dynamic components of electrostatic quantities on surface 86. In particular, the output 102 of amplifier B is connected by lines 106,108 to the detector E" reference at terminal Y forming a first feedback loop. The voltage applied to the Ref." terminal at Y will function to null any current generated in the detector circuit which flow through R" and appears at X. For example, if a 50 volt step waveform were applied to surface MS, a detector E" current would begin to flow due to C(dv/dt) to produce a signal at X. This signal X would be amplified by B and applied to detector E via terminal Y to nullify the current induced by C(dv/dt). This nullification occurs because a new current in the detector circuit will be generated between detector E" and surface MS" due to the change in detector E voltage reference caused by a change in amplifier B output and the capacitance between the detector E" and the test surface MS". Thus the output of amplifier B will drive the detector voltage via point Y to exactly 50 volts in this example to match the surface MS" voltage over wide frequency ranges to null any current generated in the detector due to C(dVs/dt).

If there exists any d.c. voltage difference between detector E and surface MS", a detector E current due to V, the voltage difference and (dC/dt), the change in the detector E" to surface MS capacitance due to the capacitance modulator M", will generate a sinusoid at the modulator frequency at terminal X and into amplifier B. The output of amplifier B will apply to the detector E" Ref" at point Y an amplified sinusoid which will null the detector E" current due to V(dC/dt), here again by causing the detector E" voltage to change to generate an equal and opposite sinusoidal current to null the V(dc/dt) induced current. Thus, the feedback signal from amplifier B applied as a feedback signal to the electrode E", reference terminal will follow and match any dynamic data on surface MS" and produce a sinusoid at the modulator frequency with an amplitude and phase indicative of the d.c. error voltage between detector F" and surface MS".

The electrostatic voltage follower of the present invention further comprises means for providing a second feedback path from the first feedback path to the input of high bandwidth amplifier 100 to cause amplifier 100 to produce at the output thereof a d.c. value necessary to null any signals in the first feedback path at the frequency of modulator 80. In particular, to establish a zero d.c. voltage error between detector E and surface MS" at all times, a second feedback loop is established. This second feedback loop employs as its input the voltage generated by the first feedback signal as found on the detector reference at point Y. A voltage divider comprising resistors R3 and R4 also designated 112 and 114, respectively, allows the low level amplifier C also designated 116 connected as a voltage follower, to handle the first feedback voltage, which can range up to plus or minus 1 or 2 kilovolts. In particular, the junction of resistors R3 and R4 is connected to the one input of amplifier 116, and the voltage divider employs a 200 to 1 division to limit voltages applied to amplifier C to 5 to 10 volts. Alternately, a capacitance divider could be used instead of R3,R4 or a summing amplifier could be substituted for amplifier C. The output of amplifier C contains a scaled down replica of the first feedback signal and therefore contains, besides any dynamic data on surface MS", a signal at the capacitance modulation frequency of the detector which signal has a magnitude proportional to the d.c. voltage error between detector E" and surface MS". The output of amplifier C is applied to the input of a demodulator DM also designated 120 which produces an output d.c. signal $V_E$ proportional to the amplitude of any signal in the first feedback path related to the modulation frequency and phase of the detector. The reference signal on line 122 into demodulator DM is obtained from point Z and is a signal representative of the modulation term (dC/dt). The demodulator output ($V_E$) is applied to the input of an integrating amplifier D also designated 124. Resistor R5 and capacitor C1 are part of the amplifier integrating circuits. The output of amplifier 124 is applied to amplifier B through R2 as a d.c. correction signal to cause amplifier B to produce at its output the d.c. value necessary to null any signals in the first feedback path which are at the frequency of modulator 80. When this null is achieved the d.c. voltage difference between the detector E" and surface MS" will be zero. Thus, the first feedback signal which is applied to detector reference terminal Ref" at Y will follow and exactly match all components, a.c. and d.c., over a wide frequency range, which are applied to surface MS". An indicator such as an oscilloscope, as shown by the device labeled ($V_{out}$) also designated 130, can be used to indicate the surface MS voltage with high accuracy and speed.

Figure 6:
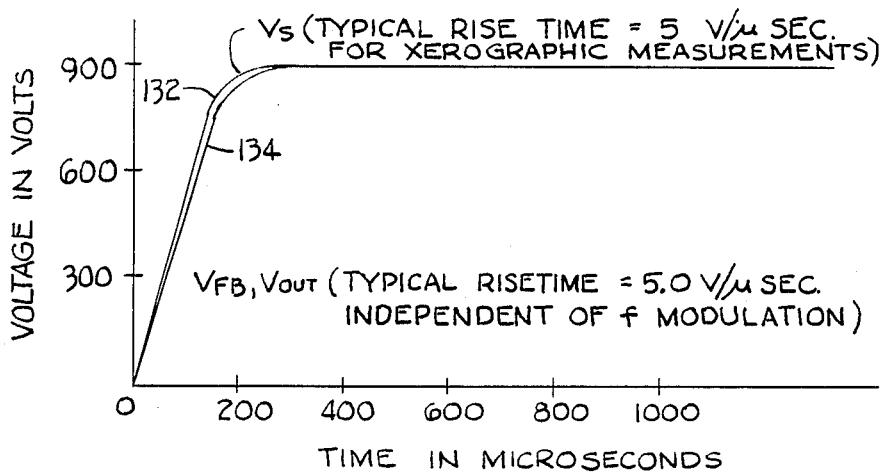
FIG. 6 is a graph including waveforms illustrating operation of the follower of FIG. 5.

FIG. 6 shows a representation of data in waveforms 132 and 134 which the high speed d.c. electrostatic voltage follower of the present invention measures. As opposed to the data shown in FIG. 4, as measured by prior art devices, the present invention can follow exactly the high speed data generated on surface MS". Advantageously this high speed measurement capability is not limited by the modulation frequency of the detector because the high speed data is processed by the high bandwidth amplifier B rather than through a Nyquist limited loop. Once stabilized, i.e. no d.c. error the second feedback loop only has to be fast enough to stabilize d.c. errors caused by thermal gradients, incidential stray ion flow to the detector electrode or amplifier offset drifts.

Figure 7:
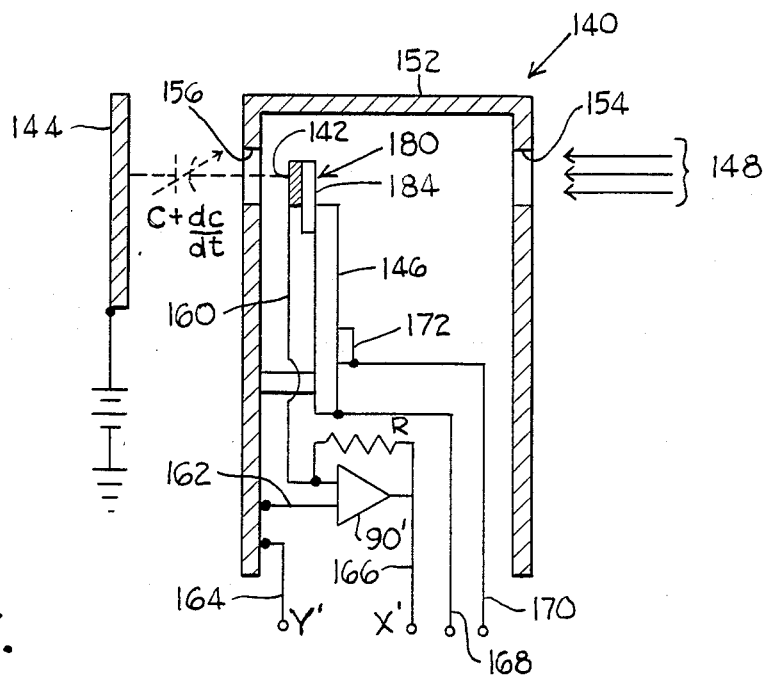
FIG. 7 is a schematic diagram, partly diagrammatic, of a probe according to the present invention for use with a non-contacting electrostatic voltage follower.

FIG. 7 illustrates a probe generally designated 140 according to the present invention for an electrostatic voltmeter including a detector electrode 142 adapted to be disposed toward a test surface 144 bearing an electrostatic quantity to be measured, modulator or driver means 146 operatively associated with the detector electrode 142 for modulating the capacitive coupling between electrode 142 and surface 144, and means defining a path for radiation represented by arrows 148 onto surface 144 for irradiating a region of surface 144 in registry with detector electrode 142. The probe and detector shown in FIG. 7 can be used to make accurate high speed non-contacting d.c. electrostatic voltage measurements on photo-conductive materials. Detector electrode 142 is produced by deposition of an ultra thin layer of conductive material such as tin, indium, or gold on a transparent material such as quartz or plastic to produce a detector electrode which is transparent or has a known index of transmission to the wavelength of light of interest and yet provides a conductive or semi-conductive surface for transmission of electrical signals into the detector amplifier designated 90' in FIG. 7. In the illustrative arrangement of FIG. 7, detector electrode 142 is mounted inside of a housing 152 which is provided with a first opening or port 154 to allow the conductive layer to be exposed to the surface under measurement and also provided with a second opening or port 156 for the passage of light or other radiation through the detector electrode 142 onto the test surface 144. Detector electrode 142 faces surface 144 and is in registry with opening 156, and opening 154 is in registry with opening 156. The detector electrode could also be extended to pass through the probe housing 152 to be placed in an area offering little room to accommodate the probe housing 152. In these extended electrode applications it is beneficial to reduce extraneous coupling to the detector electrode by using a second transparent conductive layer on the back side of the electrode.

If the detector circuit is of the low impedance type, this second shielding coating would be terminated at the probe housing which serves as a virtual ground. If a high impedance detector circuit is employed the second coating would be terminated at the output of the unity gain buffer amplifier of the detector to prevent capacitive loading of the detector signal by this driven shield as conventionally known. Either type of detector amplifier circuit would perform well for connection of this probe to the high speed d.c. electrostatic voltage follower of the present invention shown in FIG. 5. As shown in FIG. 7, detector electrode 142 is connected by lead 160 to the summing input of amplifier 90', the non-inverting input of amplifier 90' is connected by lead 162 to housing 152 serving as an electrical reference and which is connected by lead 164 to terminal Y' in a circuit similar to that of FIG. 5, and the output of amplifier 90' is connected by lead 166 to terminal X' in the circuit. Modulator or driver 146, which can be a piezoelectric transducer, is connected by lead 168 to an oscillator circuit similar to oscillator 82 in FIG. 5 and the oscillator also is connected by a lead 170 to a pick-up or sensing piezoelectric transducer 172 associated with driver 146.

To obtain the electro-optical characteristics of a photoconductive surface, the probe shown in FIG. 7 allows light or other radiation 148 to be directed onto the same area of the photoconductor 144 to which the detector electrode 142 is coupled thus providing high speed accurate measurement of the potential of the radiated surface. At very close probe or detector electrode to measured surface spacings the area on the surface 144 measured by the transparent or light transmitting probe is almost equal, within a small error, to the area of the detector electrode 142. However, as detector to surface spacings increase the capacitive coupling to an increased surface area due to capacitive fringing effects occurs. When performing electro-optical measurements at these increased spacings, errors are introduced because the same area of the surface being measured, including the fringing areas, may not be radiated. To compensate for fringing effects, a detector electrode construction is provided by the present invention to allow the fringing areas to be also radiated so that quantitative, accurate surface data can be measured.

Figure 8:
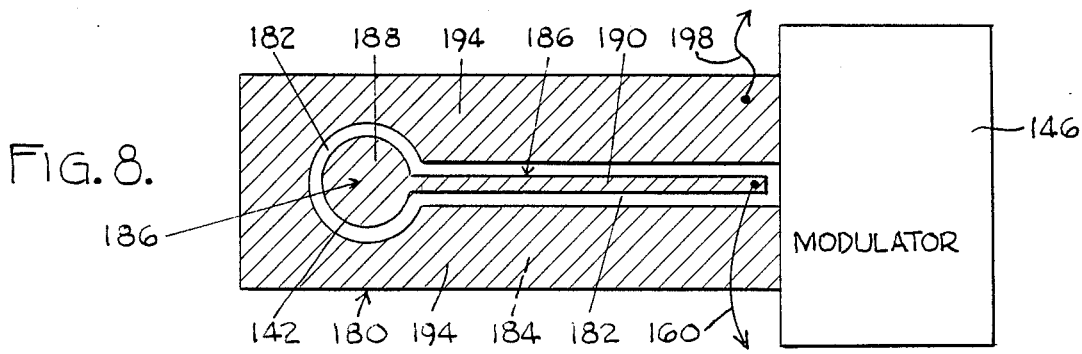
FIG. 8 is an enlarged elevational view of a portion of the probe of FIG. 7.

FIG. 8 shows a detector electrode construction according to the present invention to allow for radiation of the fringing areas coupled to the detector electrode by the fringing capacitance. There is provided a carrier element 180 of quartz or soda lime glass in thickness ranging from about 0.1 to about 1 mm material which is transmitting or transparent to radiation 148 and having a first surface 182 adapted to be disposed toward the test surface, i.e. test surface 144 shown in FIG. 7. Carrier 180 is in the form of a thin plate and in the present illustration is elongated rectangular in shape. Carrier 180 thus has a second surface 184 opposite and parallel to the first surface and is disposed toward opening 154 in the arrangement of FIG. 7.

There is provided a first film, coating or layer 186 on the first surface 182 of carrier 180 which film 186 is of electrically conductive material transparent or transmitting to radiation 148, such as indium or tin which is vacuum deposited on the carrier element to form a thin transparent, electrically conductive film. The vacuum deposited layer would be typically less than 1.0 micron thick to offer good light transmission properties and yet be electrically conductive. Commercially available products such as "Nesa" galss would be suitable for such application. Film 186 occupies less than the total area of the surface 182 of carrier 180 and defines the detector electrode 142. In particular, in the apparatus of the present illustration film 186 includes a first portion 188 of substantial surface area which in the present illustration is generally circular in shape, although other shapes can be employed. Portion 188 defines the detector electrode 142. Film 186 includes a second portion 190 which extends from the first portion and which in the present illustration is elongated, relatively narrow in width and extends along a major portion of the length of surface 182. Portion 190 functions to facilitate external electrical connection to detector electrode 142, by use of a conductive epoxy cement or other bonding system, and as shown in FIG. 8 the end of portion 190 remote from portion 188 is connected to one end of lead 160, the other end of which is connected to the input of the detector amplifier 90' as shown in FIG. 7.

There is provided a second film, coating or layer 194 on the first surface 182 of carrier 180 which film 194 is of electrically conducting material transparent or transmitting to radiation 148. Typically, film 194 is of the same material and of the same thickness as film 186. Film 194 occupies the remainder of the total surface area of surface 182 and film 194 is spaced from film 186. The surface spacing of the films 186, 194 is represented by the outline of the exposed portion of surface 182 seen in FIG. 8. Transparent and conductive surfaces 186 and 194 could be produced with a single metal deposition process which would be subsequently etched to form the separate surfaces 186 and 194.

Carrier element 180 is operatively associated with the modulator or drive means for modulating the capacitive coupling between detector electrode 142 and the test surface such as surface 144 as shown in FIG. 7. As shown in FIGS. 7 and 8, the end of carrier element 180 opposite the end containing detector electrode 142 is fixed to the free end of driver transducer 146. Transducer 146, an electrical signal to mechanical motion generator, could be of the magnetic or piezoelectric type. The two elements are bonded together by suitable means such as adhesive. As shown in FIG. 7, carrier element 180 is disposed in the path for radiation 148 such that the radiation passes through carrier 180 and through opening 156 and onto test surface 144. The provision of the spaced-apart films 186,194 on carrier 180 results in compensation being made for capacitive fringing effects by allowing for radiation of the fringing areas of the test surface coupled to the detector electrode 142 by fringing capacitance.

By way of example, carrier 180 can be a glass or other transparent assembly such as a cantilever fastened to a motion generator such as the piezoelectric driver 146. Coated on the glass are the two areas of transparent conductive material 186,194. The center circular or other geometry area serves as the detector electrode while the outer coated area serves to allow the radiation to reach the surface in a pattern slightly larger than the area of the detector electrode which is being measured by the apparatus to compensate for fringing effects. The non-coated area between the detector electrode 142 and the outer coated area or shield 194 is shown larger in FIG. 8 for clarity but can be made in the order of 10–20 microns because of the small voltage between the areas. The outer coated area or shield 194 is connected by a lead 198 to the output of a buffer or to a virtual ground connection in the detector circuit.

Although in the various embodiments there has been shown a detector which achieves capacitance modulation by moving the detector electrode E in a plane normal to the test surface, other capacitive modulation systems will work equally as well. For example, the use of an interceding electrode or electrodes between the detector and the test surface which varies the coupling between the detector and surface to achieve capacitive modulation would perform well as long as the electrode(s) did not occuld all capacitive coupling between detector and surface. If that were to happen, then any data occurring in the test surface during the period of occulsion would be lost.

Figure 9:
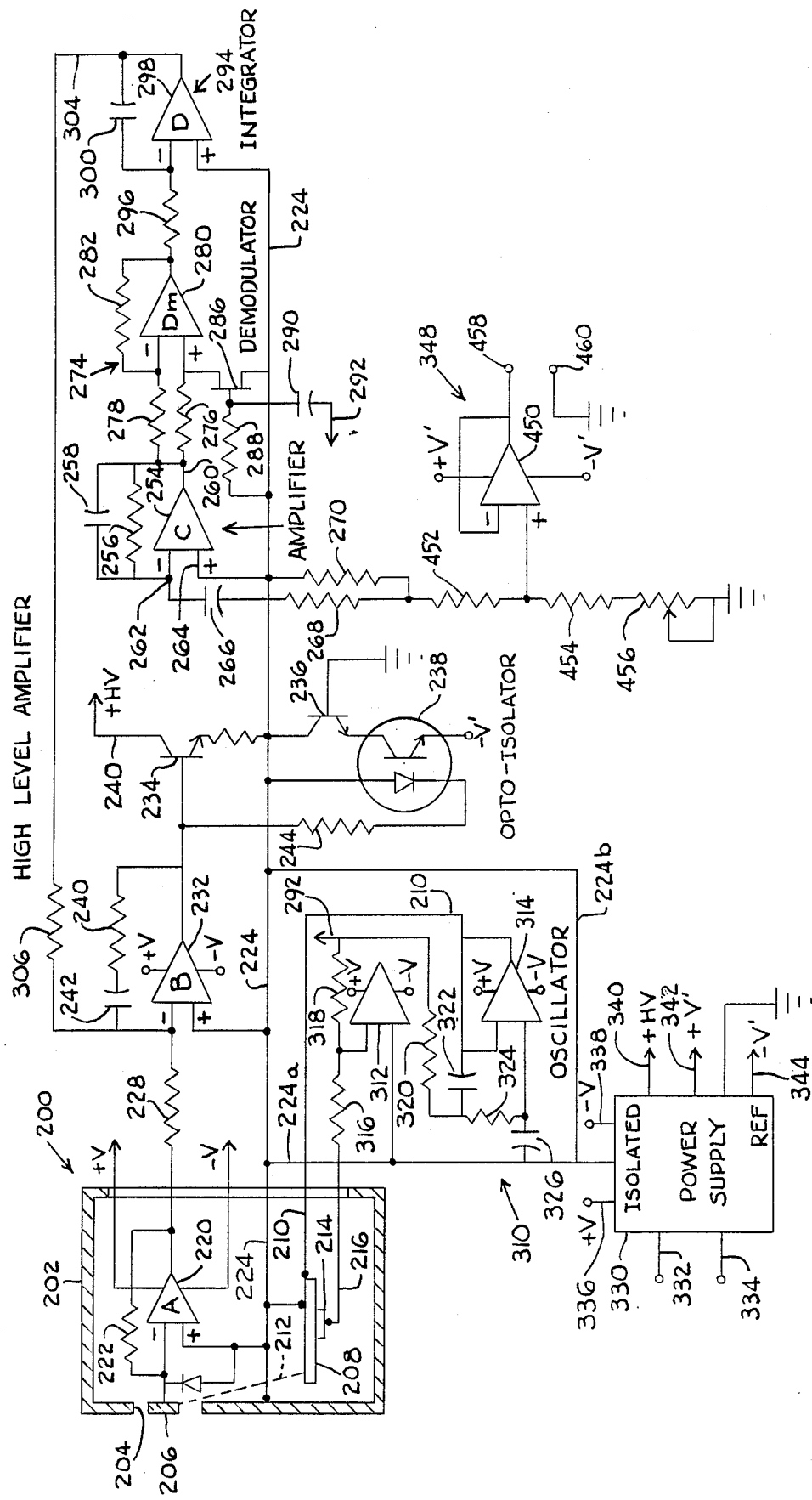
FIG. 9 is a schematic circuit diagram of a non-contacting electrostatic voltage follower according to the present invention.

FIG. 9 is a schematic circuit diagram of a non-contacting d.c. electrostatic voltage follower and probe according to the present invention. The probe generally designated 200 includes a housing 202 provided with an opening 204 in a wall thereof and containing a detector electrode 206 in registry with opening 204. Electrode 206 is vibrated by a drive transducer 208 in response to a drive signal on line 210, the coupling between electrode 206 and transducer 208 being represented by the broken line 212. A sensing means or transducer 214 mounted on driver 208 develops a motion signal on line 216. Transducers 208 and 214 can be piezoelectric. Detector amplifier 220 is similar to amplifier A in the preceding embodiments and is connected as a summing amplifier. Resistor 222 by way of illustration has a magnitude of 22 megohms. The summing input of detector amplifier 220 is connected to detector electrode 206, and the non-inverting input of amplifier 220 is connected to reference line 224 which also is connected to probe housing 202 and to driver transducer 208. The bias voltages on lines +V and −V to amplifier 220 by way of example have magnitudes of 15 volts.

The output of detector amplifier 220 is applied through a resistor 228 to the input of the high level or high bandwidth amplifier circuit generally designated 230. The circuit includes a differential amplifier 232, output transistor amplifiers 234 and 236 and an optical isolator 238. The output of differential amplifier 232 is connected through the series combination of resistor 240 and capacitor 242 to the negative input of amplifier 232. The positive input of amplifier 232 is connected to reference line 224. The output of amplifier 232 is connected through resistor 244 to the cathode of the photodiode in optical isolator 238, the anode of which is connected to reference line 224. The output of amplifier 232 also is connected to the base terminal of transistor amplifier 234, the collector of which is connected by line 246 to a source of high positive voltage +HV and the emitter of which is connected through resistor 248 to reference line 224. The base of transistor amplifier 236 is connected to electrical ground, the collector thereof is connected to reference line 224 and the emitter is connected to a source of negative bias voltage −V'. The first feedback path from the output of the high level amplifier circuit 230 to the non-inverting input of detector amplifier 220 is defined by reference line 224.

By way of example, in an illustrative circuit, amplifiers 220 and 230 are general purpose operational amplifiers, such as F.E.T. input commercial types LM 356, resistor 240 is 220K and capacitor 242 is 100 pf., resistors 244 and 248 are 4.7K each, bias voltage HV has a magnitude of 1.1 KV and bias voltage V' a magnitude of −16 v. This particular circuit arrangement will allow amplifier 232 output to drive either transistors 234 or 236 through optical coupler 238 to cause reference line 224, the first feed back path, to produce voltage levels over the range of zero to the 1.1 KV level to follow the signal produced at the output of amplifier 220 in response to the signals induced onto detector 206.

The second feedback path is defined in the following manner. There is provided an amplifier 254 conencted as a voltage follower including the parallel combination of resistor 256 and capacitor 258 connected between the amplifier output 260 and the negative input 262. The positive input 264 of amplifier 254 is connected to reference line 224 and thus to the first feedback path. The amplifier negative input 262 is connected to a network including the series combination of capacitor 266 and resistor 268 which is connected by resistor 270 to reference line 224. The output of amplifier 254 is connected to the input of a demodulator generally designated 274. In particular, the amplifier output 260 is connected by resistors 276 and 278 to the positive and negative inputs, respectively, of an operational amplifier 280. The output of amplifier 280 is connected by resistor 282 to the negative input thereof. A reference connection from the oscillator-driver circuit associated with detector electrode 206 to demodulator 273 is made in the following manner. There is provided a field effect transistor 286, the source-drain circuit of which is connected between the positive input terminal of amplifier 280 and reference line 224. The gate or control terminal of transistor 286 is connected through a resistor 288 to reference line 224 and through a capacitor 290 connected to the oscillator-driver circuit which will be described. The output of demodulator 273 is connected to the input of an integrator generally designated 294. In particular, the output of amplifier 280 is connected by a resistor 296 to the negative input of an operational amplifier 298, the positive input of which is connected to reference line 224 and the output of which is connected by capacitor 300 to the negative input thereof. The output of integrator 294 is connected to the input of high bandwidth amplifier 230 to complete the second feedback path. In particular, the output of amplifier 298 is connected by line 304 to one terminal of a resistor 306, the other terminal of which is connected to the negative input of differential amplifier 232.

By way of example, in an illustrative circuit, resistor 256 has a magnitude of 1 meghom and capacitor 258 a mgnitude of 220 pf., capacitor 266 has a magnitude of 0.022 microfarad, resistor 268 a magnitude of 100K and resistor 270 a magnitude of 10K, resistors 276 and 278 both have magnitude of 22K, J110, resistor 288 has a magnitude of 1M and capacitor 290 a magnitude of 0.22 micro farad, resistor 296 has a magnitude of 1M, capacitor 300 has a magnitude of 10 microfarad and resistor 306 has a magnitude of 100K. Amplifiers 254, 280 and 298 are general purpose operational amplifiers, such as F.E.T. input commercial type LM 356.

An oscillator-modulator circuit generally designated 310 is associated with probe 200 and includes a pair of operational amplifiers 312 and 314. The motion signal on line 216 is applied through a resistor 316 to the negative input of amplifier 312, and the positive input thereof is connected to reference line 224a. The output of amplifier 312 is connected by resistor 318 to the negative input thereof, and the amplifier output also is connected by line 292 to the demodulator circuit 274 as previously described. The output of amplifier 312 is applied by a resistor 320 to an input network of amplifier 314. In particular, the output of amplifier 312 is connected to one terminal of resistor 320, the other terminal of which is connected through a capacitor 322 to the negative input of amplifier 314 and through a resistor 324 to the positive input of amplifier 314. The positive input of amplifier 314 also is connected by a capacitor 326 to reference line 224a, and the output of amplifier 314 is connected to the negative input thereof. The output of amplifier 314 is connected to line 210 for providing a drive signal to transducer 208.

By way of example, in an illustrative circuit, amplifiers 312 and 314 are general purpose operational amplifiers, such as F.E.T. Input type LM 356, resistors 316 and 318 have magnitudes of 47K and 4.7M, respectively, resistor 320 has a magnitude of 470K, capacitor 322 has a magnitude of 0.0022 micro farads, resistor 324 a magnitude of 470K and capacitor 326 has a magnitude of 220 pico farads.

A power supply 330 is operated by line voltage applied to inputs 332,334 thereof and is connected to reference line 224b. Lines 336 and 338 provide the ±V bias voltages to the points indicated in the circuit, line 340 provides the ±HV voltage to the high bandwidth amplifier circuit and lines 342 and 344 provide the ±V' bias voltages to the points indicated in the circuit. By way of example, in an illustrative circuit, voltage V is ±15 volts, HV is 1.1 kilovolts and V' is ±16 volts.

A network for monitoring the circuit output voltage, indicative of the electrostatic quantity on the surface toward which detector electrode 206 is disposed, is generally designated 348. The network includes an amplifier 450 connected as a voltage follower. The positive input of amplifier 450 is connected through a resistor 452 to the junction of resistors 268 and 270 and is connected through the series combination of fixed resistor 454 and variable resistor 456 to electrical ground. The output of amplifier 450 is connected to one circuit output terminal 458, the other output terminal 460 being connected to electrical ground. An oscilloscope, meter or the like (not shown) can be connected across output terminals 458,460 to indicate the test surface voltage with high accuracy and speed.

By way of example, in an illustrative circuit, amplifier 450 is a general purpose operational amplifier, such as F.E.T. input type LM 356, resistors 452 and 454 have magnitudes of 10 megohms and 99 kilohms, respectively and variable resistor 456 which provides calibration has a maximum mangitude of 2 kilohms. The output voltage on terminals 458,460 is buffered at a 100:1 ratio to test surface voltage.

It is therefore apparent that the present invention accomplishes its intended objects. While embodiments of the present invention have been described in detail, that is for the purpose of illustration, not limitation.

I claim:

1. A non-contacting electrostatic voltage follower comprising:
    a) a single detector electrode sensitive to electrostatic quantities such as electrostatic fields, voltages or charges having continuous capacitive coupling to a surface;
    b) means operatively associated with said electrode for varying the capacitive coupling between said electrode and said surface bearing an electrostatic quantity to which said electrode is capacitively coupled;
    c) a detector amplifier having first and second inputs and an output, said amplifier having a high input impedance;
    d) means for connecting said detector electrode to said first input of said detector amplifier;
    e) a high bandwidth amplifier having an input and an output;
    f) means for applying the output of said detector amplifier to the input of said high bandwidth amplifier; and
    g) means for providing a first feedback path from said output of said high bandwidth amplifier to said second input of said detector amplifier in a manner producing at the output of said high bandwidth amplifier signals having dynamic components matching all dynamic components of electrostatic quantities on said surface;
    h) whereby the magnitude and phase of said signals produced by said output of said high bandwidth amplifier provide information as to the magnitude and polarity of said electrostatic quantities borne by said surface.

2. An electrostatic voltage follower according to claim 1, wherein said means for varying the capacitive coupling comprises modulator means for mechanically vibrating said electrode to produce capacitance modulation.

3. An electrostatic voltage follower according to claim 2, further including means for connecting the output of said high bandwidth amplifier to said modulator means in a manner providing a reference for said modulator means.

4. An electrostatic voltage follower according to claim 1, wherein said means for applying the output of said detector amplifier to the input of said high bandwidth amplifier comprises resistance means.

5. A non-contacting electrostatic voltage follower comprising:
    a) a single detector electrode sensitive to electrostatic quantities such as electrostatic fields, voltages or charges; having capacitive coupling to a surface;
    b) modulation means operatively associated with said electrode for providing capacitance modulation of the capacitive coupling between said electrode and said surface bearing an electrostatic quantity to which said electrode is capacitively coupled;

c) a detector amplifier having first and second inputs and an output;

d) means for connecting said detector electrode to said first input of said detector amplifier;

e) a high bandwidth amplifier having an input and an output;

f) means for applying the output of said detector amplifier to the input of said high bandwidth amplifier;

g) means for providing a first feedback path from said output of said high bandwidth amplifier to said second input of said detector amplifier; and h) means for providing a second feedback path from said first feedback path to said input of said high bandwidth amplifier to cause said high bandwidth amplifier to produce at the output thereof a d.c. value necessary to null any signals in said first feedback path at the frequency of said modulation means;

i) so that the signal in said first feedback path will follow and exactly match all a.c. and d.c. components over a wide frequency range of the electrostatic quantities on said surface.

6. An electrostatic voltage follower according to claim 5, further including means connected to said first feedback path for providing information as to the magnitude and polarity of said electrostatic quantity.

7. An electrostatic voltage follower according to claim 5, further including means for connecting said first feedback path to said modulation means to provide a reference for said modulation means.

8. An electrostatic voltage follower acording to claim 5, wherein said detector amplifier comprises a current summing amplifier wherein said first input is a summing input and said second input is a non-inverting input.

9. An electrostatic type follower according to claim 5, wherein said means for applying the output of said detector amplifier to the input of said high bandwidth amplifier comprises resistance means.

10. A non-contacting electrostatic voltage follower comprising:

a) a detector electrode sensitive to electrostatic quantities such as electrostatic fields, voltages or charges having capacitance coupling to a surface;

b) means operatively associated with said electrode for varying the capacitive coupling between said electrode and said surface bearing an electrostatic quantity to which said electrode is capacitively coupled;

c) a detector amplifier having first and second inputs and an output;

d) means for connecting said detector electrode to said first input of said detector amplifier;

e) a high bandwidth amplifier having an input and an output;

f) means for applying the output of said detector amplifier to the input of said high bandwidth amplifier;

g) means for providing a first feedback path from said output of said high bandwidth amplifier to said second input of said detector amplifier in a manner following and matching all dynamic components of electrostatic quantities on said surface whereby the magnitude and phase of said output of said high bandwidth amplifier provides information as to the magnitude and polarity of said electrostatic quantity;

h) means for providing a second feedback path from said first feedback path to said input of said high bandwidth amplifier to cause said amplifier to produce at the output thereof a d.c. value necessary to null any signals in said first feedback at the frequency of capacitance variation so that the d.c. voltage difference between said detector electrode and said surface is zero and the signal in said first feedback path will follow and exactly match all a.c. and d.c. components over a wide frequency range which are on said surface; and i) said means for providing said second feedback path comprising an amplifier having an input and an output and connected as a voltage follower, voltage divider means connected between said first feedback path and said amplifier input, demodulator means being having an input connected to the output of said amplifier and having an output, means for applying to said demodulator means a reference signal relating to the rate at which said capacitive coupling is varied so that said demodulator means produces an output d.c. signal proportional to the amplitude of any signal in said first feedback path related to the frequency and phase at which said capacitive coupling is varied, an integrating amplifier having an input and an output, means for connecting the output of said demodulator means to the input of said integrating amplifier, and means for applying the output of said integrating amplifier to the input of said high bandwidth amplifier, so that said high bandwidth amplifier produces an output signal having a d.c. value necessary to null any signal in said first feedback path having a frequency equal to the rate at which said capacitive coupling is varied.

11. An electrostatic voltage follower according to claim 10, wherein said means for connecting the output of said demodulator means to the input of said integrating amplifier comprises resistance means.

12. A non-contacting electrostatic voltage follower comprising:

a) a detector electrode sensitive to electrostatic quantities such as electrostatic fields, voltages or charges having capacitive coupling to a surface;

b) modulation means operatively associated with said electrode for providing capacitance modulation of the capacitive coupling between said electrode and said surface bearing an electrostatic quantity to which said electrode is capacitively coupled;

c) a detector amplifier having first and second inputs and an output;

d) means for connecting said detector electrode to said first input of said detector amplifier;

e) a high bandwidth amplifier having an input and an output;

f) means for applying the output of said detector amplifier to the input of said high bandwidth amplifier;

g) means for providing a first feedback path from said output of said high bandwidth amplifier to said second input of said detector amplifier;

h) means for providing a second feedback path from said first feedback path to said input of said high bandwidth amplifier to cause said high bandwidth amplifier to produce at the output thereof a d.c. value necessary to null any signals in said first feedback path at the frequency of said modulation means so that the signal in said first feedback path will follow and exactly match all a.c. and d.c. components over a wide frequency range of the electrostatic quantities on said surface; and j) said means for providing said second feedback path comprising an amplifier having an input and an output and connected as a voltage follower, voltage divider means connected between said first feedback path and said amplifier input, demodulator means having an input connected to the output of said amplifier and an output, means for connecting said modulation means to a reference input of said demodulator means, an integrating amplifier having an input and an output, means for connecting the output of said demodulator means to the input of said integrating amplifier, and means for applying the output of said integrating amplifier to the input of said high bandwidth amplifier, so that said high bandwidth amplifier produces an output signal having a d.c. value necessary to null any signal in said first feedback path having a frequency equal to that of said modulation means.

13. An electrostatic voltage follower according to claim 12, wherein said means for connecting the output of said demodulator means to the input of said integrating amplifier comprises resistance means.

14. A non-contacting electrostatic voltage follower comprising:

a) a single detector electrode sensitive to electrostatic quantities such as electrostatic fields, voltages or charges having capacitive coupling to a surface;

b) means operatively associated with said electrode for varying the capacitive coupling between said electrode and said surface bearing an electrostatic quantity to which said electrode is capacitively coupled;

c) a detector amplifier having first and second inputs and an output, said detector amplifier comprising a current summing amplifier wherein said first input is a summing input and said second input is a non-inverting input;

d) means for connecting said detector electrode to said first input of said detector amplifier;

e) a high bandwidth amplifier having an input and an output;

f) means for applying the output of said detector amplifier to the input of said high bandwidth amplifier; and g) means for providing a first feedback path from said output of said high bandwidth amplifier to said second input of said detector amplifier in a manner producing at the output of said high bandwidth amplifier signals having dynamic components matching all dynamic components of electrostatic quantities on said surface;

h) whereby the magnitude and phase of said signals produced by said output of said high bandwidth amplifier provide information as to the magnitude and polarity of said electrostatic quantities borne by said surface.

15. A non-contacting electrostatic voltage follower comprising:

a) a single detector electrode sensitive to electrostatic quantities such as electrostatic fields, voltages or charges having capacitive coupling to a surface;

b) means operatively associated with said electrode for varying the capacitive coupling between said electrode and said surface bearing an electrostatic quantity to which said electrode is capacitively coupled;

c) a detector amplifier having first and second inputs and an output;

d) means for connecting said detector electrode to said first input of said detector amplifier;

e) a high bandwidth amplifier having first and second inputs and an output;

f) means for applying the output of said detector amplifier to the input of said high bandwidth amplifier;

g) means for providing a first feedback path from said output of said high bandwidth amplifier to said second input of said detector amplifier in a manner producing at the output of said high bandwidth amplifier signals having dynamic components matching all dynamic components of electrostatic quantities on said surface; and h) means for providing a second feedback path from said first feedback path to said input of said high bandwidth amplifier to cause said amplifier to produce at the output thereof a d.c. value necessary to null any signals in said first feedback path at the frequency of capacitance variation so that the d.c. voltage difference between said detector electrode and said surface is zero and the signal in said first feedback path will follow and exactly match all a.c. and d.c. components over a wide frequency range which are on said surface;

i) whereby the magnitude and phase of said signals produced by said output of said high bandwidth amplifier provide information as to the magnitude and polarity of said elctrostatic quantities borne by said surface.

* * * * *